(12) United States Patent
Urushido

(10) Patent No.: US 7,566,977 B2
(45) Date of Patent: Jul. 28, 2009

(54) SEMICONDUCTOR DEVICE AND METHOD FOR MANUFACTURING THE SAME

(75) Inventor: Tatsuhiro Urushido, Fujimi (JP)

(73) Assignee: Seiko Epson Corporation (JP)

( * ) Notice: Subject to any disclaimer, the term of this patent is extended or adjusted under 35 U.S.C. 154(b) by 254 days.

(21) Appl. No.: 11/423,027

(22) Filed: Jun. 8, 2006

(65) Prior Publication Data

US 2006/0281293 A1 Dec. 14, 2006

(30) Foreign Application Priority Data

Jun. 9, 2005 (JP) .............................. 2005-169340

(51) Int. Cl.
*H01L 23/48* (2006.01)
*H01L 23/52* (2006.01)
*H01L 29/40* (2006.01)

(52) U.S. Cl. ...................... 257/782; 257/690; 257/781; 438/107; 438/108

(58) Field of Classification Search ................. 257/690, 257/781, 782, 783; 438/107, 108, 112
See application file for complete search history.

(56) References Cited

U.S. PATENT DOCUMENTS

| 7,057,294 B2* | 6/2006 | Shibata ........................ 257/781 |
| 2006/0055021 A1* | 3/2006 | Yamamoto .................. 257/690 |

FOREIGN PATENT DOCUMENTS

| JP | 05-335309 | 12/1993 |
| JP | 2003-249592 | 9/2003 |
| JP | 2005-203598 | 7/2005 |
| JP | 2005203558 A * | 7/2005 |

\* cited by examiner

*Primary Examiner*—Phuc T Dang
(74) *Attorney, Agent, or Firm*—Harness, Dickey & Pierce, P.L.C.

(57) ABSTRACT

A method for manufacturing a semiconductor device, includes: mounting a semiconductor chip having an electrode on a wiring substrate having a base substrate and a wiring formed on the base substrate; forming a eutectic alloy by contacting the wiring with the electrode and by heating and pressurizing, and; forming the eutectic alloy so as a part of the eutectic alloy enters between the wiring and the base substrate.

4 Claims, 4 Drawing Sheets

(A)

(B)

(A)

(B)

(C)

SEMICONDUCTOR DEVICE AND METHOD FOR MANUFACTURING THE SAME

The entire disclosure of Japanese Patent Application No. 2005-169340, filed Jun. 9, 2005 is expressly incorporated by reference herein.

BACKGROUND OF THE INVENTION

1. Technical Field

The present invention relates to a semiconductor device and a method for manufacturing the same.

2. Related Art

It is known that a semiconductor chip is mounted on a wiring substrate and electrically connected by contacting a wiring with an electrode. At this point, it is known that a eutectic alloy is formed by the wiring and the electrode. By controlling this region wherein the eutectic alloy is formed, a highly reliable semiconductor device can be manufactured.

JP-A-H5-335309 is an example of related art.

SUMMARY

An advantage of the present invention is to provide a highly reliable semiconductor device and a method for manufacturing the same.

(1) According to an aspect of the invention, a method for manufacturing a semiconductor device includes mounting a semiconductor chip that has an electrode on a wiring substrate that has a base substrate and a wiring formed on the base substrate, forming a eutectic alloy by heating and pressurizing the wiring and the electrode, and forming the eutectic alloy so as a part of the eutectic alloy enters between the wiring and the base substrate. According to the invention, a eutectic alloy can be formed within a narrow region on a wiring substrate (base substrate). Therefore, a degradation of insulation resistance between two adjacent wirings can be prevented by the eutectic alloy. In other words, according to the method for manufacturing the semiconductor device, an electrically reliable semiconductor device can be manufactured.

(2) In accordance with the manufacturing method for the semiconductor device, a peeled portion may be formed by peeling off a part of the wiring from the base substrate during the mounting process of the semiconductor chip on the wiring substrate, and may form the eutectic alloy so as to enter between the peeled portion and the base substrate.

(3) In accordance with the manufacturing method for the semiconductor device, the eutectic alloy may be formed avoiding a region overlapping with the electrode between the wiring and the base substrate.

(4) According to another aspect of the invention, a semiconductor device has a wiring substrate that has a base substrate and a wiring which is formed on the base substrate, and an electrode, including a semiconductor chip that is mounted on the wiring substrate so as the electrode faces the wiring and a eutectic alloy that is formed so as to come in contact with the electrode, and a part of the eutectic alloy is being disposed between the wiring and the base substrate. This enables a surface facing the base substrate in accordance with the wiring to come in contact with the eutectic alloy. Therefore, a contact area between the eutectic alloy and the wiring can be enlarged. And the eutectic alloy is being formed so as to come in contact with the electrode. Thus, according to the invention, the wiring and the electrode can be electrically connected in a stable condition. That is, according to the invention, a semiconductor device that has a highly reliable electrical connection can be provided.

(5) In accordance with the semiconductor device, the eutectic alloy may be formed so as to avoid a region overlapping with the electrode between the wiring and the base substrate.

BRIEF DESCRIPTION OF THE DRAWINGS

The invention will be described with reference to the accompanying drawings, wherein like numbers reference like elements.

DESCRIPTION OF THE EMBODIMENTS

Embodiments to which the present invention is applied will now be described in detail below with reference to the drawings. However, the invention is not restricted to the embodiments described below.

FIGS. 1 through 7 are diagrams illustrating a method for manufacturing a semiconductor device according to an embodiment to which the present invention is applied.

Figure 1:
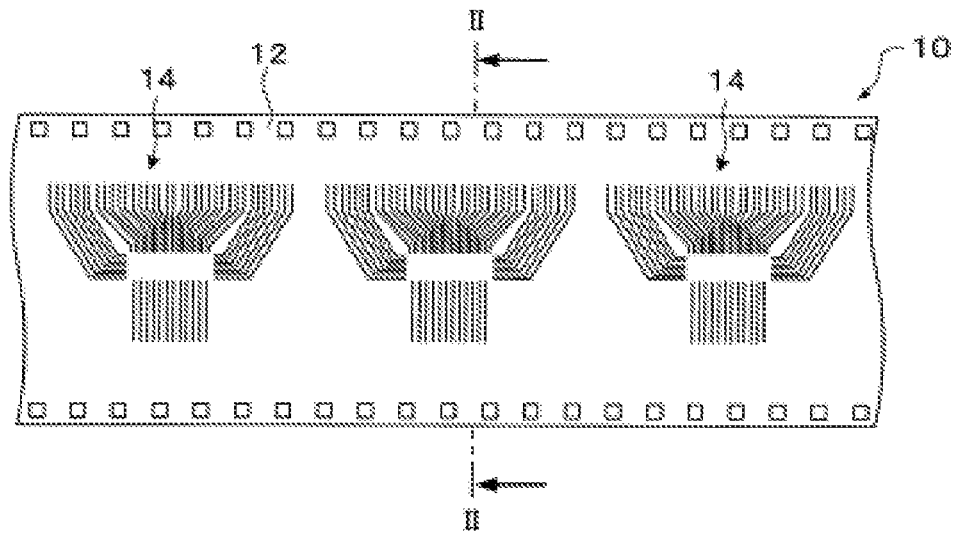
FIG. 1 is a diagram illustrating a method for manufacturing a semiconductor device according to an embodiment to which the present invention is applied.
Figure 2:
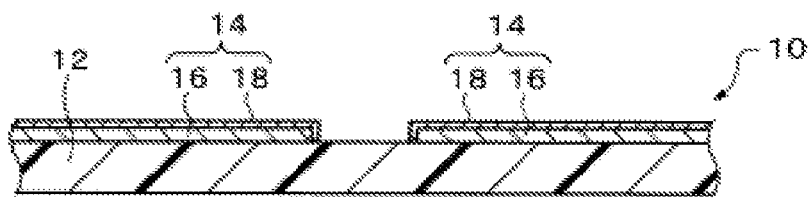
FIG. 2 is a diagram illustrating a method for manufacturing a semiconductor device according to an embodiment to which the invention is applied.
Figure 3:
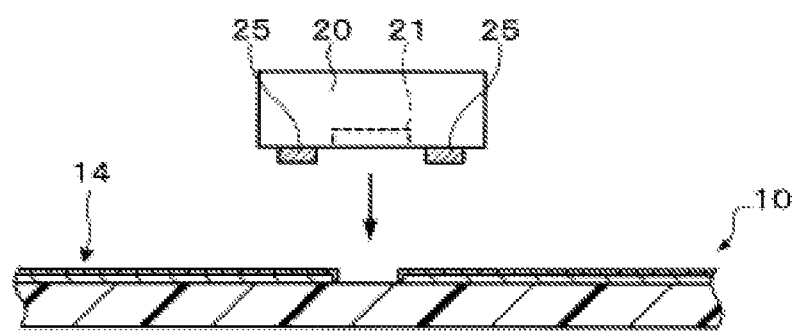
FIGS. 3A and FIG. 3B are diagrams illustrating a method for manufacturing a semiconductor device according to an embodiment to which the invention is applied.
Figure 3:
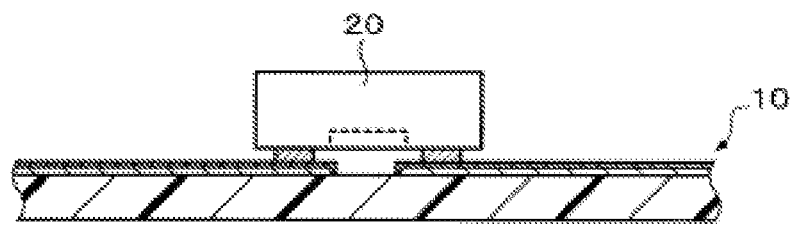
Figure 4:
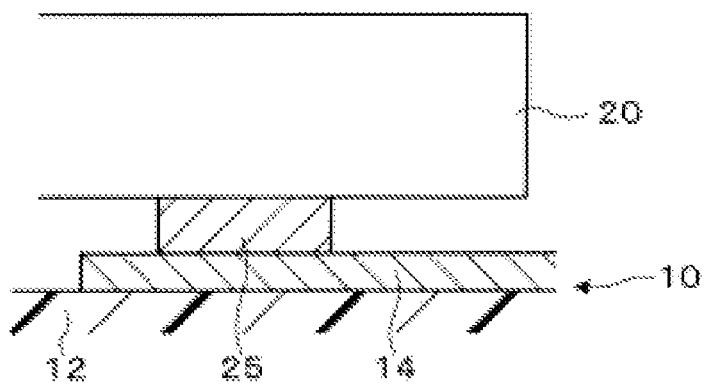
FIGS. 4A through 4C are diagrams illustrating a method for manufacturing a semiconductor device according to an embodiment to which the invention is applied.
Figure 4:
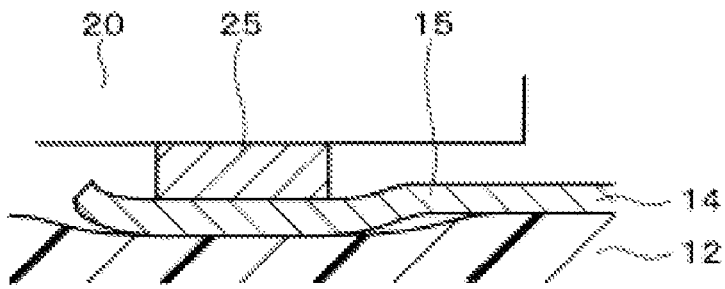
Figure 4:
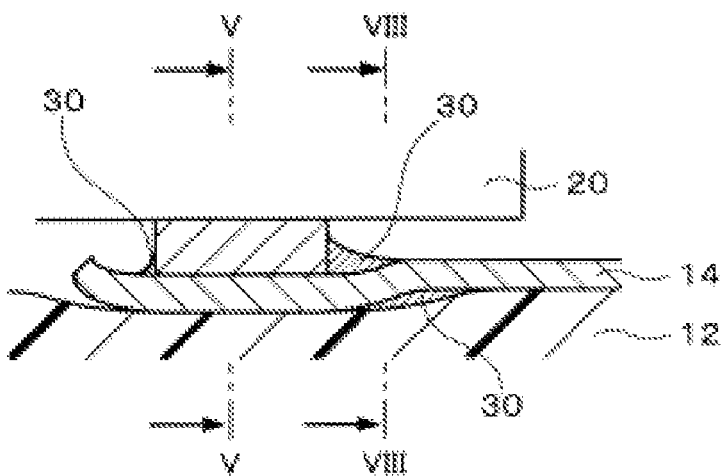

A method for manufacturing a semiconductor device according to the present embodiment may include preparing a wiring substrate 10. By using FIG. 1 and FIG. 2, a structure of the wiring substrate 10 is to be explained below. Further, FIG. 1 is showing a top view of the wiring substrate 10, and FIG. 2 is an enlarged partial view of a section cut along the line II-II of FIG. 1.

The wiring substrate 10 has a base substrate 12. A material and a structure of the base substrate 12 are not particularly restricted, and may use any substrate which has become publicly known. The base substrate 12 may be a flexible substrate, or a rigid substrate. Alternatively, the base substrate 12 may be a tape substrate. The base substrate 12 may be a stacked-type substrate, or a single-layer substrate. Further, an exterior of the base substrate 12 is not particularly restricted. Furthermore, a material of the base substrate 12 is not particularly restricted. The base substrate 12 may be formed of a material either in organic or inorganic, or may have a composite structure. The base substrate 12, for example, may be a resin substrate. A substrate or a film made of a polyethylene terephthalate (PET), for example, may be used as the base substrate 12. Alternatively, the flexible substrate made of a polyimide resin may be used as the base substrate 12. As the flexible substrate, an FPC (Flexible Printed Circuit) or a tape used in TAB (Tape Automated Bonding) technology may be used. Also, as the base substrate 12 formed of an inorganic material, examples of a ceramic substrate and a glass substrate are to be included. As the composite structure of organic and inorganic materials, an example of a glass epoxy substrate is to be included. As the base substrate 12, a substrate that does not have a through-hole (so-called device hole) may be used. However, the base substrate 12 may be a substrate that has a through-hole (device hole) which is not shown.

The wiring substrate 10 has a wiring 14. The wiring 14 is being formed on the base substrate 12. The wiring 14 may be formed on the surface of the base substrate 12. The wiring 14 may be provided directly on the surface of the base substrate 12. Alternatively, the wiring 14 may be bonded to the base substrate 12 with an adhesive which is not shown. The structure of the wiring 14 is not particularly restricted. The wiring 14 may be composed of a multilayer. For example, the wiring 14 may have a structure of a plating layer 18 formed on a core pattern 16. The core pattern 16 may be formed in a single metal layer. The core pattern 16 may be formed in copper at this point. Or else, the core pattern 16 may be formed in a plurality of metal layers. The core pattern 16, at this point, may have a structure which either, for example, copper (Cu), chromium (Cr), titanium (Ti), nickel (Ni) or titanium tungsten (Ti—W) is stacked. Further, the plating layer 18 may be a tin layer.

A method for forming the wiring 14 (core pattern 16) is not particularly restricted, and may apply any of the method which has become publicly known. For example, form a first metal layer on the base substrate 12 by sputtering, and form a second metal layer on the first metal layer by a plating process, so that the core pattern 16 may be formed by patterning the first and the second metal layers. A double-layered core pattern is formed by this. Alternatively, the core pattern 16 may be formed by bonding a copper foil onto the base substrate 12, and then by patterning this. The wiring 14 may be formed by forming the plating layer 18 onto these core patterns 16. Or else, the wiring 14 may be formed by forming the first metal layer on the base substrate 12, then form a patterned solder resist on the first metal layer, followed by forming a single-layer or a plurality of layers of metal pattern on the first metal layer by plating process, and then patterning the first metal layer.

The wiring substrate 10 may have an internal wiring which go through the inside of the base substrate 12 (not shown). Also, the wiring substrate 10 may have a resin layer which is not shown. The resin layer may be referred to as a solder resist. The resin layer may be formed so as to partially cover the wiring 14.

A method for manufacturing a semiconductor device according to the embodiment may include preparing a semiconductor chip 20 (see FIG. 3A). An integrated circuit 21 may be formed on the semiconductor chip 20. The structure of the integrated circuit 21 is not particularly restricted, but for example, may include an active element such as a transistor, or may include passive elements such as a resistor, a coil or a capacitor. The semiconductor chip 20 has an electrode 25. The electrode 25 may be electrically connected to the inside of the semiconductor chip 20. Alternatively, it may be referred to as the electrode 25 including an electrode that is not electrically connected to the inside of the semiconductor chip 20. The surface of the electrode 25, for example, may be formed by gold. The electrode 25, for example, may include a pad and a bump formed on the pad. The bump may be a gold bump, at this point. Alternatively, the bump may have a structure of a gold-plated nickel bump. Further, the semiconductor chip 20 may have a passivation film which is not shown. The passivation film, for example, may be formed of $SiO_2$, SiN, polyimide resin or the like.

A method for manufacturing a semiconductor device according to the embodiment may include, as shown in FIG. 3A and FIG. 3B, mounting a semiconductor chip 20 on a wiring substrate 10, contacting a wiring 14 with an electrode 25, and further forming a eutectic alloy 30 by heating and pressurizing these. The present process, for example, may include disposing the semiconductor chip 20 above the wiring substrate 10, adjusting the positions of the wiring 14 and the electrode 25 so as to overlap with each other (see FIG. 3A), press the semiconductor chip 20 against the wiring substrate 10, and then mounting the semiconductor chip 20 on the wiring substrate 10 (see FIG. 3B).

In the present process, a part of the eutectic alloy 30 is formed so as to enter between the base substrate 12 and the wiring 14. When the semiconductor chip 20 is mounted on the wiring substrate 10, a peeled portion 15 may be formed by peeling off a part of the wiring 14 from the base substrate 12, and the eutectic alloy 30 may be formed so as to enter between the base substrate 12 and the wiring 14 (peeled portion 15). With reference to FIG. 4A through FIG. 4C, an example of a process the eutectic alloy 30 is formed, is to be described below. Further, the eutectic alloy 30, for example, may be a eutectic alloy of gold and tin.

At first, as shown in FIG. 4A, an electrode 25 of a semiconductor chip 20 is brought into contact with a wiring 14 on a wiring substrate 10. Then, by pressing the wiring substrate 10 against the semiconductor chip 20, as shown in FIG. 4B, peel off a part of the wiring 14 from the base substrate 12. A portion of the wiring 14 peeled off from the base substrate 12 may be referred to as a peeled portion 15. A part of the wiring 14 may be peeled off by pressing the electrode 25 from above the wiring 14 against the base substrate 12, and deforming the wiring substrate 10 (by plastic deformation of the base substrate 12). In further detail, the base substrate 12 and the wiring 14 may be peeled off, by deforming the wiring substrate 10 by pressing the electrode 25 against the wiring substrate 10 so that a force is generated between a boundary of the base substrate 12 and the wiring 14. Particularly when the base substrate 12 is a resin substrate, the base substrate 12 can extend longer than the wiring 14. This enables to easily peel off a part of the wiring 14 from the base substrate 12.

Then form a eutectic alloy 30 by the wiring 14 and the electrode 25. In a method for manufacturing a semiconductor device according to the embodiment, the eutectic alloy 30, as shown in FIG. 4C, is to be formed so as to enter between the wiring 14 (peeled portion 15) and the base substrate 12. The eutectic alloy 30 may be formed avoiding a region overlapping with the electrode 25 between the base substrate 12 and the wiring 14 at this point. By forming the eutectic alloy 30 in a state that the electrode 25 is pressed against the wiring substrate 10, the eutectic alloy 30 may be formed so as not to enter the region overlapping with the electrode 25 between the base substrate 12 and the wiring 14.

Figure 5:
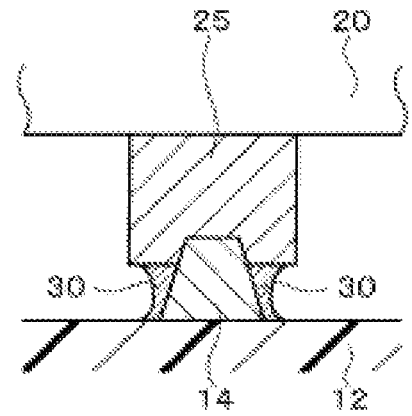
FIG. 5 is a diagram illustrating a method for manufacturing a semiconductor device according to an embodiment to which the invention is applied.

Further, in the present process, the semiconductor chip 20 may be mounted so as the region overlapping with the electrode 25 in accordance with the wiring 14 do not peel off from the base substrate 12. For example, the peeling may be prevented by using the electrode 25 to press the wiring 14 against the base substrate 12, and pressure welding the base substrate 12 and the wiring 14 in the region overlapping with the electrode 25. And as shown in FIG. 4C and FIG. 5, the eutectic alloy 30 may be formed avoiding the region overlapping with the electrode 25 between the wiring 14 and the base substrate 12. Furthermore, FIG. 5 is a section cut along the line V-V of FIG. 4C.

The present process may be performed in a heated environment. Also, the present process may be performed by applying ultrasonic vibration to at least one of either the wiring substrate 10 or the semiconductor chip 20. This enables to form the eutectic alloy 30 efficiently, as well as making it easy to peel off the base substrate 12 and the wiring 14. Therefore, the eutectic alloy 30 may be formed so as to enter between the base substrate 12 and the wiring 14 without fail.

Figure 6:
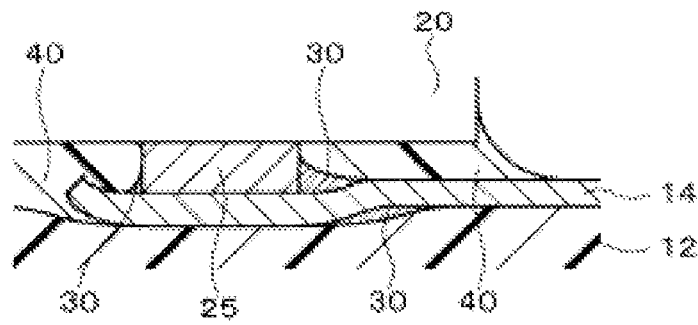
FIG. 6 is a diagram illustrating a method for manufacturing a semiconductor device according to an embodiment to which the invention is applied.
Figure 7:
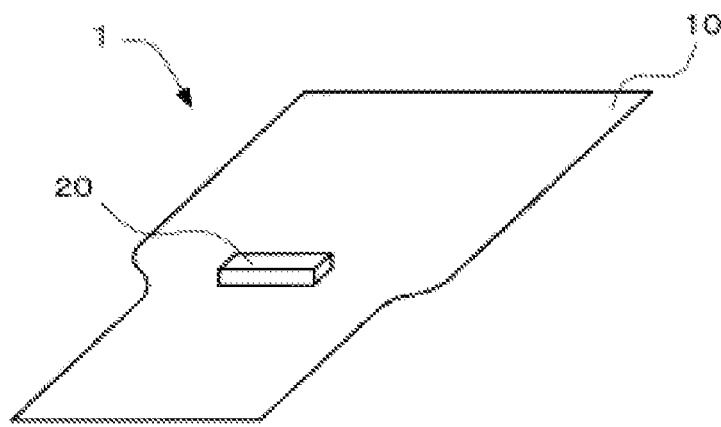
FIG. 7 is a diagram illustrating a method for manufacturing a semiconductor device according to an embodiment to which the invention is applied.

A method for manufacturing the semiconductor device according to the embodiment may include, as shown in FIG. 6, forming a sealing resin 40. Thus enables to prevent an occurrence of an electric short-circuit between an edge of the semiconductor chip 20 and the wiring 14, and between the eutectic alloys 30. Then by further going through an inspection process and a punching process, a semiconductor device 1 as shown in FIG. 7 may be formed.

As described earlier, in a method for manufacturing the semiconductor device according to the embodiment, a part of the eutectic alloy 30 is formed so as to enter between the base substrate 12 and the wiring 14. This enables to reduce a size of a region wherein the eutectic alloy 30 is formed in accordance with the surface of the base substrate 12. In other words, as a part of the eutectic alloy 30 enters between the base substrate 12 and the wiring 14, an amount of the eutectic alloy 30 that appears on the surface of the base substrate 12 can be small. Thus enables to prevent the eutectic alloy 30 to spread out along the surface of the base substrate 12. Therefore, an insulation resistance can be secured between the adjacent wirings. In other words, a degradation of the electric reliability caused by the eutectic alloy 30 can be prevented. Also, as the eutectic alloy 30 enters between the wiring 14 and the base substrate 12, the eutectic alloy 30 can be brought into contact with the surface facing the base substrate 12 in accordance with the wiring 14. Therefore, as the contact area of the eutectic alloy 30 and the wiring 14 is large, an electrically reliable semiconductor device can be manufactured.

A semiconductor device 1 according to the embodiment to which the present invention is applied, has a wiring substrate 10. The wiring substrate 10 has a base substrate 12 and a wiring 14 that is formed on the base substrate 12. The semiconductor device 1 includes a semiconductor chip 20. The semiconductor chip 20 has an electrode 25, and the electrode 25 is mounted on the wiring substrate 10 so as to face the wiring 14. The wiring substrate 10 includes a eutectic alloy 30 that is formed so as to come in contact with the electrode 25. A part of the eutectic alloy 30 is being disposed between the base substrate 12 and the wiring 14. This enables the eutectic alloy 30 to come in contact with the surface facing the base substrate 12 in accordance with the wiring 14. Therefore, a contact surface of the eutectic alloy 30 and the wiring 14 can be enlarged without enlarging a region wherein the eutectic alloy 30 is formed. When the contact surface between the eutectic alloy 30 and the wiring 14 is enlarged, the electric connection reliability of the eutectic alloy 30 and the wiring 14 improves. And the eutectic alloy 30 is formed so as to come in contact with the electrode 25. Thus, by the eutectic alloy 30, the electrical connection reliability of the wiring 14 and the electrode 25 improves. In other words, by the semiconductor device 1, a semiconductor device that has a high insulation resistance between the adjacent wirings 14, and also has a highly reliable electric connection between the wiring 14 and the electrode 25 can be provided. Further, as a part of the eutectic alloy 30 enters between the wiring 14 and the base substrate 12, it is possible to make the eutectic alloy 30 difficult to detach from the wiring 14.

Further, in the semiconductor device 1, the eutectic alloy 30, as shown in FIG. 4C and FIG. 5, may be formed avoiding the region overlapping with the electrode 25 between the wiring 14 and the base substrate 12.

Figure 8:
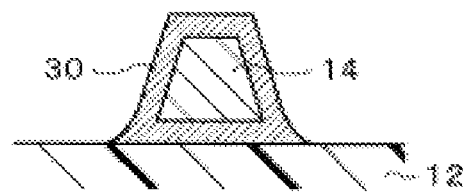
FIG. 8 is a diagram illustrating a semiconductor device according to an embodiment to which the invention is applied.

Furthermore, in the semiconductor device 1, the wiring 14, as shown in FIG. 8, wherein a cross section that is cut on a plane perpendicular to a lengthwise direction of the wiring 14 may have a non-contacting portion with the base substrate 12. The eutectic alloy 30 may be formed so as to surround a part of the wiring 14 (at least a part of the peeled portion 15) at this point. In other words, the wiring 14 may have a portion surrounded by the eutectic alloy 30. Further, FIG. 8 is a section cut along the line VIII-VIII of FIG. 4C.

Figure 9:
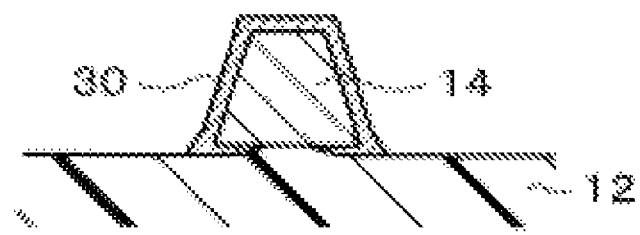
FIG. 9 is a diagram illustrating a modification of a semiconductor device according to an embodiment to which the invention is applied.

However, a semiconductor device according to the present embodiment is not restricted to this. The wiring 14, as shown in FIG. 9, may be formed so as a cross-section that is cut on a plane perpendicular to a lengthwise direction of the wiring 14 does not have a non-contacting portion with the base substrate 12. In other words, as shown in FIG. 9, a cross section of the wiring 14 that at least a part of the base comes in contact with the base substrate 12 may be continuously shaped. For example, a center portion of the base of the cross section that is cut on a plane perpendicular to the lengthwise direction of the wiring 14 may come in contact with the base substrate 12 at any time. Further, the eutectic alloy 30 may be formed so as to enter only between an edge of the base of the cross-section of the wiring 14 and the base substrate.

Furthermore, the present invention is not restricted to the above embodiments, but can be modified in various ways. For example, the present invention includes a structure substantially the same as the structure described in the embodiment (For example, a structure with the same function, method, and result, or a structure with the same object and effect). Further, the invention includes a structure that a non-essential part is replaced from the structure described in the embodiment. Furthermore, the invention includes a structure that can result in the same effect or a structure that can achieve the same object as the structure described in the embodiment. Also, the invention includes a structure that a known art is added to the structure described in the embodiment.

What is claimed is:

1. A semiconductor device, comprising:
   a base substrate;
   a wiring that is formed on the base substrate, a first portion of the wiring being peeled off from the base substrate;
   an electrode;
   a semiconductor chip that is mounted on the wiring so that the electrode faces the wiring; and
   a eutectic alloy that is formed so as to come in contact with the electrode, the eutectic alloy being formed so as to surround the first portion of the wiring,
   a part of the eutectic alloy being disposed between the wiring and the base substrate.

2. A semiconductor device, according to claim 1, wherein the eutectic alloy is formed avoiding a region overlapping with the electrode between the wiring and the base substrate.

3. A semiconductor device, comprising:
   a base substrate;
   a wiring that is formed on the base substrate, the wiring having a second portion, the second portion of the wiring having a first surface facing the base substrate, a first part of the first surface of the second portion of the wiring being in contact with the base substrate, a second part of the first surface of the second portion of the wiring not being contacting in contact with the base substrate;

an electrode;

a semiconductor chip that is mounted on the wiring so that the electrode faces the wiring; and a eutectic alloy that is formed so as to come in contact with the electrode, a part of the eutectic alloy being disposed between the wiring and the base substrate, a part of the eutectic alloy being disposed between the second part of the first surface of the second portion of the wiring and the base substrate.

4. A semiconductor device, comprising:

a base substrate;

a wiring that is formed on the base substrate, the wiring having a second portion, the second portion of the wiring having a first surface facing the base substrate, a first part of the first surface of the second portion of the wiring being in contact with the base substrate, the first part of the first surface of the second portion of the wiring being positioned in the center of the first surface of the second portion of the wiring, a second part of the first surface of the second portion of the wiring not being in contact with the base substrate;

an electrode;

a semiconductor chip that is mounted on the wiring so that the electrode faces the wiring; and a eutectic alloy that is formed so as to come in contact with the electrode, a part of the eutectic alloy being disposed between the wiring and the base substrate.

* * * * *

UNITED STATES PATENT AND TRADEMARK OFFICE
CERTIFICATE OF CORRECTION

PATENT NO. : 7,566,977 B2
APPLICATION NO. : 11/423027
DATED : July 28, 2009
INVENTOR(S) : Tatsuhiro Urushido It is certified that error appears in the above-identified patent and that said Letters Patent is hereby corrected as shown below:

Col 7, Line 3　　　　　　　after "being", delete "contacting"

Signed and Sealed this

Eleventh Day of May, 2010

David J. Kappos
*Director of the United States Patent and Trademark Office*